United States Patent
Olofsson

(10) Patent No.: US 6,206,269 B1
(45) Date of Patent: Mar. 27, 2001

(54) SOLDERING OF A SEMICONDUCTOR CHIP TO A SUBSTRATE

(75) Inventor: Lars-Anders Olofsson, Järfälla (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/410,034

(22) Filed: Oct. 1, 1999

(30) Foreign Application Priority Data

Oct. 2, 1998 (SE) .................................................... 9803350

(51) Int. Cl.⁷ .............................. B23K 31/02; B23K 1/20; B23K 35/24; H01L 21/44; H01L 21/4763
(52) U.S. Cl. .................. 228/123.1; 228/208; 228/262.3; 228/262.6; 228/262.71; 427/455; 427/456; 427/126.5; 427/126.6; 438/612; 438/614; 438/628; 438/622; 438/648; 438/650; 438/654; 438/656
(58) Field of Search ................................ 228/123.1, 208, 228/262.3, 262.6, 262.71; 427/455, 126.5, 126.6; 438/455, 612, 614, 622, 648, 650, 654, 656, 760

(56) References Cited

U.S. PATENT DOCUMENTS

| | | |
|---|---|---|
| 4,734,755 | 3/1988 | Schierz . |
| 4,772,935 * | 9/1988 | Lawler et al. . |
| 4,786,569 | 11/1988 | Rohde et al. . |
| 4,935,320 | 6/1990 | Rohde et al. . |
| 5,156,322 * | 10/1992 | Do-Thoi et al. . |
| 5,197,654 * | 3/1993 | Katz et al. . |
| 5,234,149 * | 8/1993 | Katz et al. . |
| 5,234,153 * | 8/1993 | Bacon et al. . |
| 5,254,201 | 10/1993 | Konda et al. . |
| 5,454,929 * | 10/1995 | Kinghorn . |
| 5,614,291 | 3/1997 | Kondo et al. . |
| 5,622,305 * | 4/1997 | Bacon et al. . |
| 5,629,564 * | 5/1997 | Nye, III et al. . |
| 5,671,881 * | 9/1997 | Osawa . |
| 5,965,278 * | 10/1999 | Finley et al. . |
| 6,062,461 * | 5/2000 | Sparks et al. . |

FOREIGN PATENT DOCUMENTS

| | | |
|---|---|---|
| 1309510 | 10/1992 | (CA) . |
| 276 760 A1 | 3/1990 | (DE) . |

OTHER PUBLICATIONS

Metals Handbook, 8th ed., vol. 8,: Gold–Tin Phase Diagram.*

* cited by examiner

Primary Examiner—Patrick Ryan
Assistant Examiner—Colleen Cooke
(74) Attorney, Agent, or Firm—Burns, Doane, Swecker & Mathis, L.L.P.

(57) ABSTRACT

The present invention relates to a method of soldering a semiconductor chip to a substrate, such as to a capsule in an RF-power transistor, for instance. The semiconductor chip is provided with an adhesion layer consisting of a first material composition. A solderable layer consisting of a second material composition is disposed on this adhesion layer. An antioxidation layer consisting of a third material composition is disposed on said solderable layer. The antioxidation layer is coated with a layer of gold-tin solder. The chip is placed on a solderable capsule surface, via said gold-tin solder. The capsule and chip are exposed to an inert environment to which a reducing gas is delivered and the capsule and chip are subjected to a pressure substantially beneath atmospheric pressure whilst the gold-tin solder is heated to a temperature above its melting point. The gas pressure is increased whilst the gold-tin solder is molten and the temperature is lowered when a predetermined gas pressure is exceeded, so that the gold-tin solder will solidify.

8 Claims, No Drawings

SOLDERING OF A SEMICONDUCTOR CHIP TO A SUBSTRATE

FIELD OF INVENTION

The present invention relates generally to a method and to a device produced by said method for soldering a semiconductor chip to a substrate, and particularly for soldering said semiconductor chip to a capsule in an RF-power transistor.

BACKGROUND OF THE INVENTION

At present time, chips are mounted in RF-power transistors and RF-power modules by means of a eutectic gold-silicon soldering process. The capsules used are metallised, often with nickel and a relatively thick layer of gold (2–5 μm). The chips (transistors, resistors and capacitors) to be arranged in the capsules are provided with a very thin layer of gold on their bottom surfaces. This gold layer functions to prevent oxidation of the bottom surface of the chip. When using gold-silicon, the capsule is heated to a temperature of 400–450° C. and chips are then placed individually against the capsule and rubbed or scrubbed forwards and backwards until an alloy is formed between the silicon in the chip and the gold on the capsule. It is not possible to determine precisely the point at which this alloy begins to form. This step in the process is therefore normally carried out manually, so that an operator will be able to observe when an alloy has been formed and effective soldering has been achieved.

Although all the gold present on the capsule (beneath the chip) is consumed in this soldering process, there remains a large silicon surplus in the chip. This surplus of silicon can migrate into the molten AuSi alloy and there precipitate out in the form of Si-crystals. This process is accelerated at elevated temperatures and also when mechanical rubbing, or scrubbing, is vigorous. Consequently, it is not suitable/possible to effect this scrubbing process mechanically or with ultrasound, since an excessively large amount of Si-crystals will then collect in the molten AuSi alloy. Drawbacks with an excessively large amount of Si-crystals in the molten alloy is that the melt obtains a viscous consistency and will not therefore flow outwards and effectively wet the surface.

These silicon crystals will effectively enclose any air bubbles that may have formed between chip and capsule. Such bubbles drastically impair the thermal conductivity between the chip and the capsule. The total thickness of an AuSi alloy joint formed by the gold on the capsule and the silicon in the chip can never be more than about 50% greater than the thickness of the gold. Thus, when the gold has a thickness of 4 μm, the joint will only have a thickness of about 6 μm. This places high demands on the surface flatness or smoothness of the capsule, since otherwise solder deficiencies between chip and capsule may arise.

It is generally known that additional AuSi solder can be applied between chip and capsule in the way of a preform. This is very often difficult and expensive to achieve, due to the small dimensions of such preforms. It is not possible in practice to work with preforms that have a material thickness smaller than about 25 μm. A joint of this thickness, however, will increase the thermal resistance between chip and capsule to an unacceptable degree.

SUMMARY OF THE INVENTION

One problem with known techniques for soldering semiconductor chips to a substrate, for instance a capsule in an RF-power transistor, is that the soldering process requires a manual working step in soldering each chip per se.

Another problem with known techniques is that the formation of Si-crystals impairs solder flow and results in the entrapment of bubbles. These bubbles are liable to impair the transport of heat away from the chip.

Yet another problem with known techniques is that the high solidification temperature of the SiAu solder results in high mechanical stresses between chip and capsule, therewith placing an upper limit on the size of the chip. The chip will crack if this limit is exceeded.

Still another problem with known techniques is that in order to prevent the mechanical stresses from cracking a chip, it is necessary to mount several small chips instead, therewith increasing costs in this respect.

Another problem with known techniques is that a high working temperature (400–450° C.) when mounting chips means that atoms are able to diffuse from a nickel layer beneath the gold layer up through said gold and be oxidised to cause bonding and soldering problems. This must be counteracted with a special nickel plating technique and a thick gold layer on surfaces that do not actually require a thick gold layer for AuSi soldering purposes.

Still another problem with known techniques is that the high working temperature incurred with the chip mounting process means that the parts of the actual capsule must be joined together with a hard solder or braising solder that has still a higher melting point, for instance AgCu at 790° C. Joining of metals and ceramics at this high temperature will result in the occurrence of high mechanical stresses after cooling of the joins, due to the fact that those metals and ceramics that are suitable in this context do not have mutually the same coefficient of thermal expansion. This limits the design of the capsule. For instance, it is not possible to use the optimum metals copper and the ceramic AlN in the capsule, since the coefficients of expansion of these materials are much too different from one another.

Yet another problem with known techniques is that the relatively thin solder joint formed places great demands on the surface smoothness or flatness of the capsules, since otherwise a solder deficiency will occur such that not all of the chips will be soldered effectively. This drastically impairs thermal conductivity between chip and capsule.

The present invention addresses these problems by providing a method of soldering a semiconductor chip to a substrate, such as a capsule in an RF-power transistor for instance. The semiconductor chip is first provided with an adhesion layer consisting of a first material composition. A solderable layer of a second material composition is then disposed on this adhesion layer. There is then disposed on the solderable layer an antioxidation layer consisting of a third material composition. A layer of solder consisting of a gold-tin alloy is then coated on the antioxidation layer. The chip is placed on a solderable capsule surface, via said gold-tin solder. The capsule and the chip are exposed to an inert environment to which there is added a reduction gas and the capsule and chip are subjected to pressure that is substantially beneath atmospheric pressure, while heating the gold-tin alloy in the solder to a temperature above its melting temperature. The gas pressure is increased whilst the gold-tin solder is in a molten state and the temperature is lowered upon exceeding a predetermined gas pressure, so that the gold-tin alloy will solidify.

In accordance with one preferred embodiment of the inventive method, the first material composition is titanium-tungsten composition (TiW), the second material composition is nickel (Ni), and the third material composition is gold (Au).

In another preferred embodiment of the inventive method, the first material composition is titanium (Ti), the second material composition is platinum (Pt) and the third material composition is gold (Au).

According to another preferred embodiment of the inventive method, composition of the gold-tin solder is compensated by the gold from the capsule, so that a final alloy composition will lie as close as possible to the eutectic melting point.

In another preferred embodiment of the inventive method, the gold-tin alloy in the solder has a composition of 75% Au and 25% Sn when the capsule includes a 3–4 μm thick layer of gold to which the chip shall be soldered.

According to still another preferred embodiment of the inventive method, the reducing gas is formic acid in a vapor state.

In one embodiment of an RF-power transistor according to the invention, the transistor includes at least one RF-power semiconductor chip and a capsule. The semiconductor chip is provided with an adhesion layer consisting of a first material composition, a solderable layer of a second material composition disposed on said adhesion layer, and an antioxidation layer of a third material composition disposed on said solderable layer. The chip is disposed on a solderable capsule surface via a solder containing a gold-tin alloy that has an alloy composition close to the eutectic melting point.

The object of the present invention is to enable a pore-free solder joint to be obtained between a semiconductor chip and a substrate, such as a capsule in an RF-power transistor, for instance, where there is desired a low solder solidification temperature that will enable aluminium nitride to be used as a ceramic insulator in certain types of capsule instead of beryllium oxide, which is highly toxic.

One advantage afforded by the present invention is that the entire procedure from the step of positioning the chips to the step of soldering the chips firmly to the capsule can be automated.

Another advantage afforded by the present invention is that the thickness of a solder joint can be precisely determined so as to adapt to the curvature of the capsules and to minimise the thermal resistance of the solder joint.

Another advantage afforded by the present invention is that the thermal conductivity of the gold-tin alloy in the solder joint is roughly twice that of a solder joint consisting of a gold-silicon alloy.

Yet another advantage afforded by the present invention is that the relatively low soldering temperature reduces the risk of nickel diffusion through the gold to a minimum. Consequently, the gold thickness on the capsules can be reduced from 3–5 μm to the 0.5–1 μm required with wire bonding. In addition to lowering costs, this thinner gold coating also greatly reduces the risk of poor solder joints between the capsules and printed circuit board as a result of gold contaminating the tin-lead solder. It is also possible to plate selectively a very thin gold layer on those parts of the connecting tabs to be soldered onto printed circuit boards.

Yet another advantage afforded by the present invention is that the gold-tin soldering process is a batch operation which enables a large number of capsules to be processed at one and the same time. This is particularly beneficial in respect of those types of capsule that can be handled in array form, since manufacturing costs are therewith greatly reduced.

Another advantage afforded by the present invention is that soldering with a solder consisting of a gold-tin alloy is carried out at a temperature of only about 300° C., therewith enabling the method of manufacturing the actual capsules to be radically changed. The present hard soldering or braising of the capsule parts at 790° C. can be replaced with a hard soldering process at a much lower temperature, for instance soldering with a solder comprising a gold-silicon alloy at 380° C. This latter process results in far smaller thermodynamic stresses between the ceramics and the metal in the capsule, therewith enabling the use of materials that have poorer thermal matching properties, such as copper and aluminium nitride, for instance, such as to obtain such benefits as improved thermal conductivity and non-toxicity.

The invention will now be described in more detail with reference to preferred exemplifying embodiments thereof and also with reference to the accompanying drawings.

DETAILED DESCRIPTION OF PREFERRED EMBODIMENTS

Gold-tin soldering requires the presence of solderable surfaces on both substrate and semiconductor chip. This is achieved with respect to the semiconductor chips, by coating the semiconductor chips, which have been finally processed in other respects, with an adhesive layer against the semiconductors, which may be silicon for instance. A solderable layer is disposed on the adhesion layer and an antioxidation layer is disposed on said solderable layer. The adhesion layer may, for instance, comprise TiW (titanium-tungsten), while the solderable layer may comprise Ni (nickel) and the antioxidation layer may comprise Au (gold). The adhesion layer may alternatively consist of pure titanium, in which case the solderable layer may consist of platinum and the antioxidation layer may consist of gold.

The adhesion layer may have a thickness ranging between 1000–1500 Å, while the solderable layer may have a thickness of 1000–1500 Å and the antioxidation layer a thickness of 5000–10000 Å. A thick layer of a gold-tin solder alloy is applied to the antioxidation layer or is applied in conjunction with applying said antioxidation layer. This ensures that metal solder will be available for each chip and therewith obviate the need of handling solder preforms.

Gold-tin solder can be applied in a number of different ways, for example by selective plating, deposition in the form of solder paste by means of stencil printing or screen printing. The solder is preferably sputtered or plated on the rear side of a semiconductor chip or very thin gold-tin foil can be fastened to the rear side of said semiconductor chip, either by fusing said foil onto said plate or by thermo-compression bonding.

Because the capsules in which the chip or chips shall be placed is not absolutely flat, the amount of solder used must be adapted so as to ensure that the volume between chip and capsule will always be filled with the gold-tin solder. A gold-tin thickness of 10 μm is required in the case of a chip having a length of 5 mm, for instance, and in the case of capsules having a permillage of 5.

A gold coating is always found on the capsules where the chip is mounted. This gold will alloy with the gold-tin solder and raise the melting point if the solder originally had an alloy composition that lay exactly on the eutectic melting point.

In order to avoid this, the chip is coated with a gold-tin alloy having a composition that takes into account the gold arriving from the capsule. A suitable composition may, for instance, be 75% Au and 25% Sn on a capsule containing 3–4 μm gold. This results in a final alloy composition that lies very close to the eutectic melting point of 280° C.

Bubbles will often form in the solder joint, when soldering chips onto capsules. Because the occurrence of such bubbles is controlled by how the solder wets the two soldering surfaces, it is not possible to prevent the formation of such bubbles. These gas bubbles are very deleterious in solder joints present in high power components, such as in RF-power transistors, for instance, since they cause overheating of the components. This problem can be minimised, by soldering at the lowest possible gas pressure, for instance a pressure of 1–10 torr. When soldering is completed, the ambient pressure on the solder joint is increased, for instance to normal atmospheric pressure, prior to cooling the components, so that the solder will solidify. Any gas bubbles that have formed during the solder smelting process will therewith be compressed so as to become practically harmless. The volume of such a gas bubble will be reduced relative to the pressure difference and in the case of the aforesaid pressure difference the volume of the gas bubbles will be reduced by about a factor of 100.

The gold-tin alloy concerned is readily oxidised and the oxide (tin-oxide) obstructs satisfactory wetting and flow of the solder. The use of conventional flux is not suitable in the soldering operation, since conventional fluxes result in not-readily dissolved decomposition products at the soldering temperature in question (300–350° C.). Furthermore, it is very difficult, impractical and expensive to try to wash away flux residues. Consequently, a gaseous flux may be used in the soldering process. In the present case, there is used a small volume of formic acid vapour to which an inert gas is added. The inert gas used may, for instance, be nitrogen gas. The nitrogen gas may be caused to pass through a vessel that contains fumic acid prior to being delivered to the chamber in which soldering shall take place. The nitrogen gas thus entrains fumic acid molecules into the chamber. The fumic acid vapour reduces the oxide of the tin to provide metallic tin and also gaseous rest products. This obviates the need to clean the components subsequent to said soldering operation.

It will be understood that the invention is not restricted to the aforedescribed and illustrated exemplifying embodiments thereof, and that modifications can be made within the scope of the following claims.

What is claimed is:

1. A method of soldering a semiconductor chip to a substrate, the method comprising:

coating the semiconductor chip with an adhesion layer consisting of a first material composition;

covering the adhesion layer with a solderable layer consisting of a second material composition;

covering said solderable layer with an antioxidation layer consisting of a third material composition;

covering the antioxidation layer with a layer of gold-tin solder;

placing the chip on a solderable surface of a capsule via said gold-tin solder;

exposing said capsule and said chip to an inert environment to which a reducing gas is delivered, and subjecting said capsule and said chip to a pressure that is substantially beneath atmospheric pressure whilst heating the gold-tin alloy to a temperature above its melting temperature;

increasing the gas pressure whilst the gold-tin solder is molten; and lowering the temperature when exceeding a predetermined gas pressure so that the gold-tin solder will solidify.

2. A method according to claim 1, wherein the first material composition is titanium-tungsten, the second material composition is nickel and the third material composition is gold.

3. A method according to claim 1, wherein the first material composition is titanium, the second material composition is platinum, nickel or a mixture thereof, and the third material composition is gold.

4. A method according to claim 1, wherein the composition of the gold-tin solder is adapted to compensate for the gold that is obtained from the capsule, such as to obtain a final alloy composition that has a eutectic melting point or a melting point close to said eutectic melting point.

5. A method according to claim 4, wherein the gold-tin solder comprises 75% Au and 25% Sn when the capsule includes a 3–4 µm thick gold layer.

6. A method according to claim 1, wherein the reducing gas is formic acid vapour.

7. A method according to claim 1, wherein said pressure substantially beneath atmospheric pressure is a pressure of 1–10 torr.

8. A method according to claim 1, wherein the lowering the temperature step solidifies the gold-tin solder to solder the semiconducting chip to the substrate.

* * * * *